US010056273B2

(12) United States Patent
Sasaki et al.

(10) Patent No.: US 10,056,273 B2
(45) Date of Patent: Aug. 21, 2018

(54) HEATING APPARATUS, SUBSTRATE HEATING APPARATUS, AND METHOD OF MANUFACTURING SEMICONDUCTOR DEVICE

(71) Applicant: CANON ANELVA CORPORATION, Kawasaki-shi, Kanagawa-ken (JP)

(72) Inventors: Masao Sasaki, Hachioji (JP); Kazutoshi Yoshibayashi, Kawasaki (JP); Kenji Sato, Koganei (JP); Kenzou Murata, Tachikawa (JP)

(73) Assignee: Canon Anelva Corporation, Kawasaki-shi, Kanagawa-ken (JP)

( * ) Notice: Subject to any disclaimer, the term of this patent is extended or adjusted under 35 U.S.C. 154(b) by 0 days.

(21) Appl. No.: 15/696,213

(22) Filed: Sep. 6, 2017

(65) Prior Publication Data

US 2018/0082865 A1    Mar. 22, 2018

Related U.S. Application Data

(63) Continuation of application No. PCT/JP2016/077490, filed on Sep. 16, 2016.

(51) Int. Cl.
*H01L 21/67* (2006.01)
*H05B 3/24* (2006.01)
(Continued)

(52) U.S. Cl.
CPC ........ *H01L 21/67098* (2013.01); *H01L 21/22* (2013.01); *H01L 21/324* (2013.01); *H05B 3/24* (2013.01)

(58) Field of Classification Search
CPC .. H01L 21/67098; H01L 21/22; H01L 21/324
See application file for complete search history.

(56) References Cited

U.S. PATENT DOCUMENTS 5,310,453 A * 5/1994 Fukasawa ........... H01L 21/6833
438/716
5,958,140 A * 9/1999 Arami ............... C23C 16/45502
118/715
(Continued)

FOREIGN PATENT DOCUMENTS

CN   101499419   8/2009
CN   105899934   8/2016
(Continued)

OTHER PUBLICATIONS

International Search Report (PCT/ISA/210) dated Oct. 11, 2016, by the Japanese Patent Office as the International Searching Authority for International Application No. PCT/JP2016/077490.
(Continued)

*Primary Examiner* — Nathan W Ha
(74) *Attorney, Agent, or Firm* — Buchanan Ingersoll & Rooney PC

(57) ABSTRACT

A heating apparatus includes a heater, an electron reflection plate, a filament arranged between the heater and the electron reflection plate, a heating power supply configured to supply an AC voltage between a first terminal and a second terminal of the filament to emit thermoelectrons from the filament, an acceleration power supply configured to supply an acceleration voltage between the filament and the heater, and a resistor arranged so as to form a path which connects the electron reflection plate and the heating power supply.

10 Claims, 9 Drawing Sheets

(51) Int. Cl.
 *H01L 21/324* (2006.01)
 *H01L 21/22* (2006.01)

(56) References Cited

U.S. PATENT DOCUMENTS

| | | | |
|---|---|---|---|
| 7,897,523 B2 | 3/2011 | Shibagaki et al. | |
| 2002/0005171 A1* | 1/2002 | Hori | C23C 16/4411 118/724 |
| 2003/0166305 A1* | 9/2003 | Shinya | H01L 21/67098 438/7 |
| 2003/0180970 A1* | 9/2003 | Suzuki | H01L 21/67098 438/5 |
| 2004/0159997 A1* | 8/2004 | Han | H01L 21/67098 269/296 |
| 2005/0062388 A1 | 3/2005 | Camm et al. | |
| 2008/0197780 A1* | 8/2008 | Yamazawa | H01J 37/32091 315/111.21 |
| 2013/0017626 A1* | 1/2013 | Tomioka | H01J 37/32192 438/3 |
| 2014/0008352 A1 | 1/2014 | Uemura et al. | |
| 2015/0228513 A1* | 8/2015 | Parkhe | H01L 21/67103 219/444.1 |
| 2015/0262834 A1* | 9/2015 | Belostotskiy | H01L 21/31116 438/705 |
| 2015/0289316 A1* | 10/2015 | Shimizu | H05B 6/6447 438/795 |
| 2016/0334321 A1* | 11/2016 | Koike | G01N 15/0606 |
| 2017/0194162 A1* | 7/2017 | Liu | H01L 21/67115 |

FOREIGN PATENT DOCUMENTS

| | | |
|---|---|---|
| JP | 2008-53066 A | 3/2008 |
| JP | 2009-43951 A | 2/2009 |
| JP | 2014-158009 A | 8/2014 |

OTHER PUBLICATIONS

Written Opinion (PCT/ISA/237) dated Oct. 11, 2016, by the Japanese Patent Office as the International Searching Authority for International Application No. PCT/JP2016/077490.

Office Action issued in corresponding Taiwanese Patent Application No. 106100736, dated Jun. 25, 2018, with English Translation, 10 pages.

* cited by examiner

COMPARATIVE EXAMPLE

HEATING APPARATUS, SUBSTRATE HEATING APPARATUS, AND METHOD OF MANUFACTURING SEMICONDUCTOR DEVICE

This application is a continuation of International Patent Application No. PCT/JP2016/077490 filed on Sep. 16, 2016, the entire content of which is incorporated herein by reference.

TECHNICAL FIELD

The present invention relates to a heating apparatus, a substrate heating apparatus, and a method of manufacturing a semiconductor device.

BACKGROUND ART

In manufacturing a semiconductor device, a step of heating a semiconductor substrate rapidly can be necessary. In particular, a high temperature of about 2,000° C. can be needed for annealing to activate a semiconductor substrate having a wideband gap which is typified by a substrate of silicon carbide (SiC). Patent literature 1 describes a back surface electron bombardment heating apparatus. This heating apparatus includes a heating container which includes a heating plate, a reflector, a filament arranged between the heating plate and the reflector, a heating power supply which energizes and heats the filament via two electrodes, and an acceleration power supply which applies an acceleration voltage to the filament. The heating container which includes the heating plate is grounded. The acceleration power supply applies the acceleration voltage between the filament and the heating container so that the filament is at a negative potential. The reflector and the filament are electrically connected to each other, and are at the same negative potential.

CITATION LIST

Patent Literature

PTL1: Japanese Patent Laid-Open No. 2008-53066

SUMMARY OF INVENTION

Technical Problem

In an arrangement described in patent literature 1, a filament includes two terminals, and an AC current flows through the filament when a heating power supply supplies an AC voltage between the two terminals. Thermoelectrons are emitted from the filament with this AC current. A potential difference exists between the two terminals of the filament. Thus, even if a reflector and one terminal of the filament are electrically connected to each other, and are at the same potential, the same potential difference as the potential difference between the two terminals of the heating power supply exists between the reflector and the other terminal of the filament. A potential gradient along the filament is formed between the two terminals of the filament. Accordingly, a potential difference exists between the reflector and each portion of the filament. In a period during which the potential of the filament in a certain portion becomes lower than the potential of the reflector, thermoelectrons emitted from the portion of the filament are drawn into the reflector. Such thermoelectrons do not enter a heating plate, and thus do not contribute to heating of the heating plate. Therefore, a temperature distribution with the temperature of a portion facing the portion of the filament lower than that of another portion can be formed in the heating plate. Such a temperature distribution can also be formed in a substrate heated by the heating plate. This makes it impossible to heat the substrate uniformly.

The present invention has been made in recognition of the above problem and provides a technique advantageous in uniformly heating a heating target object such as a substrate.

Solution to Problem

According to an aspect of the present invention, there is provided a heating apparatus which includes a heater, an electron reflection plate, a filament arranged between the heater and the electron reflection plate, a heating power supply configured to supply an AC voltage between a first terminal and a second terminal of the filament to emit thermoelectrons from the filament, and an acceleration power supply configured to supply an acceleration voltage between the filament and the heater, the heating apparatus including a resistor arranged so as to form a path which connects the electron reflection plate and the heating power supply.

Advantageous Effects of Invention

According to the present invention, a technique advantageous in uniformly heating a heating target object such as a substrate is provided.

DESCRIPTION OF EMBODIMENTS

An exemplary embodiment of the present invention will be described below with reference to the accompanying drawings.

Figure 1:
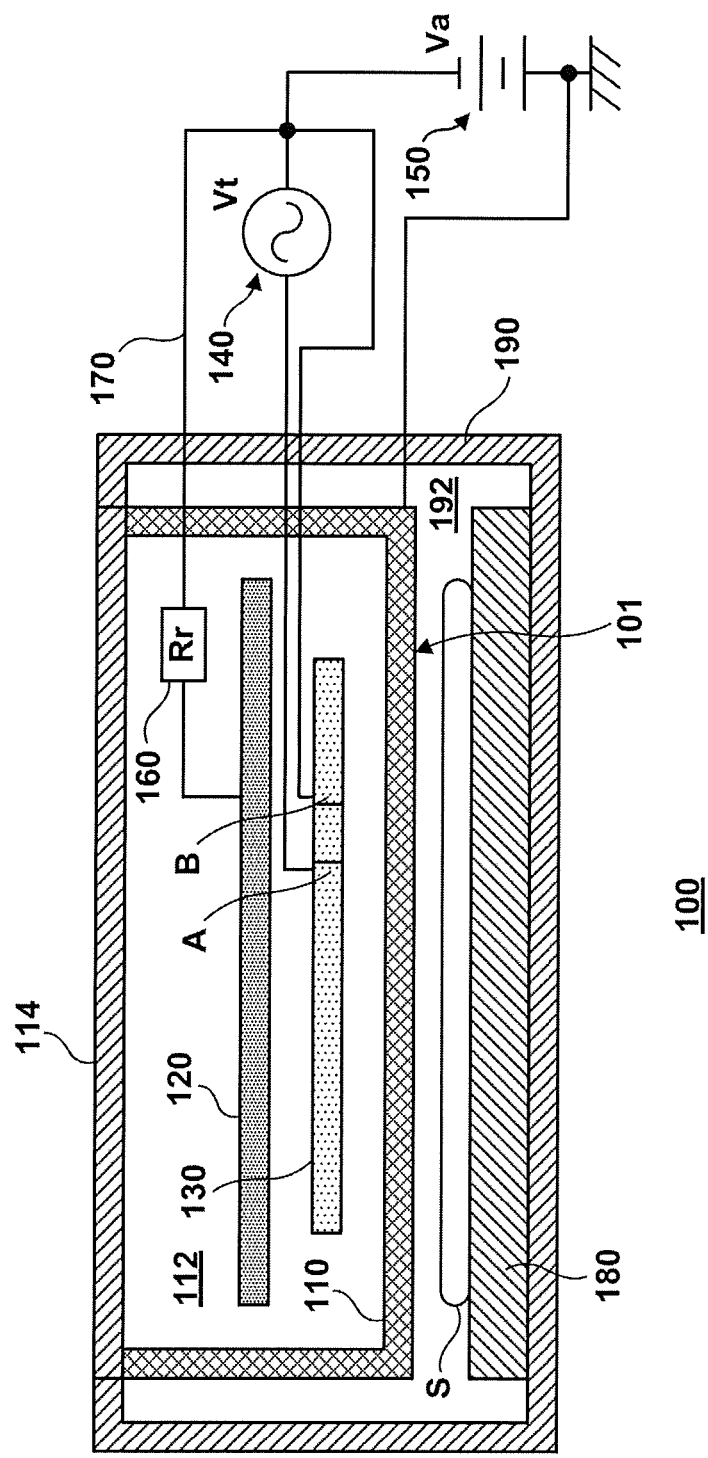
FIG. 1 is a view showing the arrangement of a substrate heating apparatus according to an embodiment of the present invention.

FIG. 1 schematically shows the arrangement of a substrate heating apparatus 100 according to an embodiment of the present invention. The substrate heating apparatus 100 includes a substrate holding unit 180 which holds a substrate S, a heating apparatus 101 arranged so as to heat the substrate S held by the substrate holding unit 180, and a chamber 190 which defines a process space 192. A pump (not shown) creates a reduced-pressure environment in the process space 192, and the substrate S can undergo annealing in this reduced-pressure environment.

Figure 2:
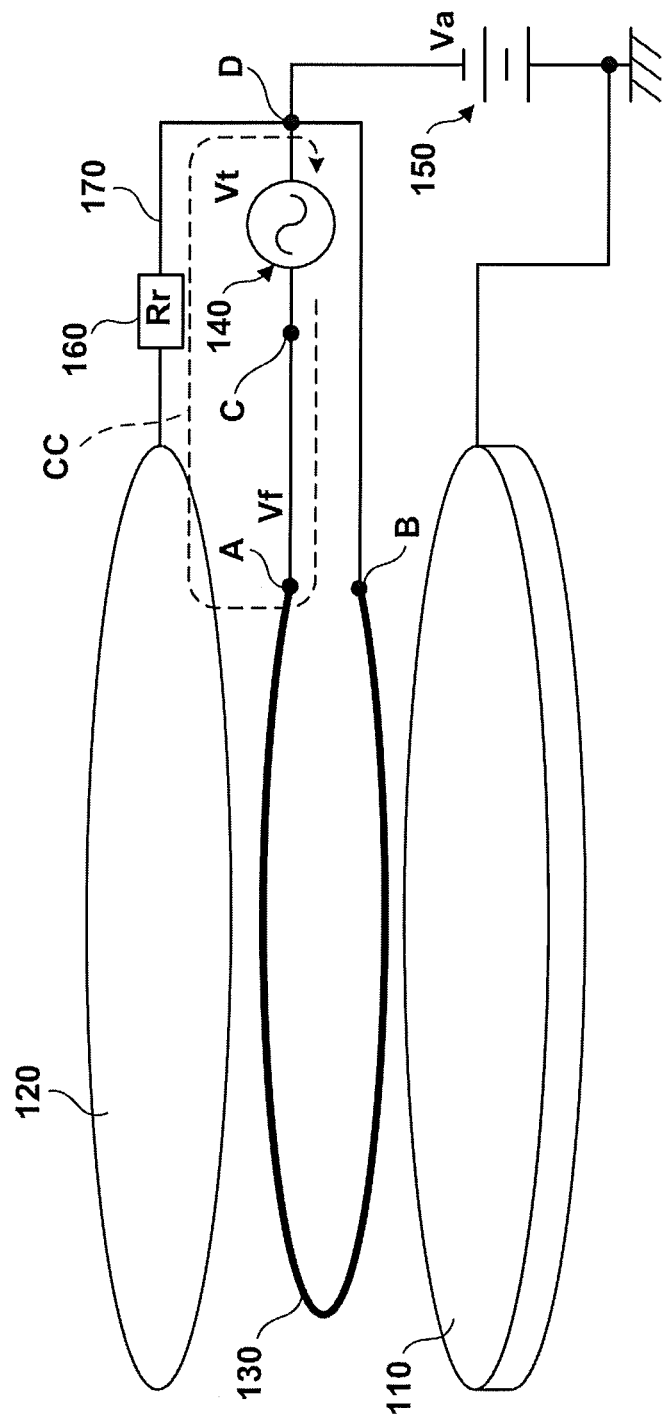
FIG. 2 is a view showing the arrangement of a heating apparatus according to the embodiment of the present invention.

FIG. 2 schematically shows the arrangement of the heating apparatus 101. The heating apparatus 101 is configured to heat a heating target object such as a substrate. The heating apparatus 101 includes, for example, a heater 110, an electron reflection plate 120, a filament 130, a heating power supply 140, an acceleration power supply 150, and a resistor 160. The heater 110 and the electron reflection plate 120 are arranged so as to face each other. The filament 130 is arranged between the heater 110 and the electron reflection plate 120.

The filament 130 can be a single loop filament. The filament 130 includes a first terminal A and a second terminal B. The heating power supply 140 supplies an AC voltage Vt between the first terminal A and the second terminal B of the filament 130. Consequently, an AC current flows through the filament 130, and thermoelectrons are emitted from the filament 130. The maximum value of the AC voltage Vt is, for example, 50 V, and the frequency of the AC voltage Vt is, for example, 50 Hz. However, the present invention is not limited to these. The maximum value of a current supplied by the heating power supply 140 to the filament 130 can be, for example, about 40 A.

The acceleration power supply 150 supplies a DC acceleration voltage Va between the filament 130 and the heater 110. Note that the acceleration power supply 150 applies a negative potential to the filament 130 with reference to the potential of the heater 110. The heater 110 can be grounded. Consequently, an acceleration electric field from the heater 110 to the filament 130 is formed and with this acceleration electric field, the thermoelectrons are accelerated in a direction from the filament 130 to the heater 110. The acceleration voltage Va can be, for example, −2,000 V.

The thermoelectrons emitted from the filament 130 and accelerated by the acceleration electric field formed between the filament 130 and the heater 110 by the acceleration power supply 150 collide against the heater 110. The kinetic energy of the thermoelectrons is converted into the heat energy by the collision of the thermoelectrons against the heater 110, heating the heater 110. The heater 110 is made of an electrically conductive material such as carbon in order to draw the thermoelectrons. The heater 110 can form at least a part of a vacuum chamber 114 which defines a vacuum space 112 in which the filament 130 and the electron reflection plate 120 are arranged. The electron reflection plate 120 reflects the thermoelectrons emitted from the filament 130. The electron reflection plate 120 is made of an electrically conductive member and arranged to face the heater 110.

The resistor 160 is arranged so as to form a path 170 which connects the electron reflection plate 120 and the heating power supply 140. The heating power supply 140 supplies the AC voltage Vt to the filament 130, forming a closed circuit CC passing through the filament 130, the electron reflection plate 120, and the path 170. The path 170 can be formed to connect the electron reflection plate 120 and a node (in this example, a fourth terminal D to be described later) in the closed circuit CC. The acceleration voltage Va is supplied to the electron reflection plate 120 via the resistor 160.

The heating power supply 140 includes a third terminal C connected to the first terminal A of the filament 130 and the fourth terminal D connected to the second terminal B of the filament 130. The acceleration power supply 150 supplies the acceleration voltage Va between the heater 110 and the fourth terminal D of the heating power supply 140. The resistor 160 can form, for example, the path 170 so as to connect the electron reflection plate 120 and the fourth terminal D of the heating power supply 140.

A resistance value Rr of the resistor 160 can be a value higher than a resistance value between the filament 130 and the electron reflection plate 120 in a state in which the heating power supply 140 supplies the AC voltage to the filament 130. The resistance value Rr can have a value, for example, from 100Ω (inclusive) to 100 kΩ (inclusive). The resistance value Rr can preferably have a value from 1 kΩ (inclusive) to 10 kΩ (inclusive). The resistance value Rr can more preferably have a value from 2 kΩ (inclusive) to 4 kΩ (inclusive). The resistor 160 can be made of a molybdenum silicide alloy.

Figure 3A:
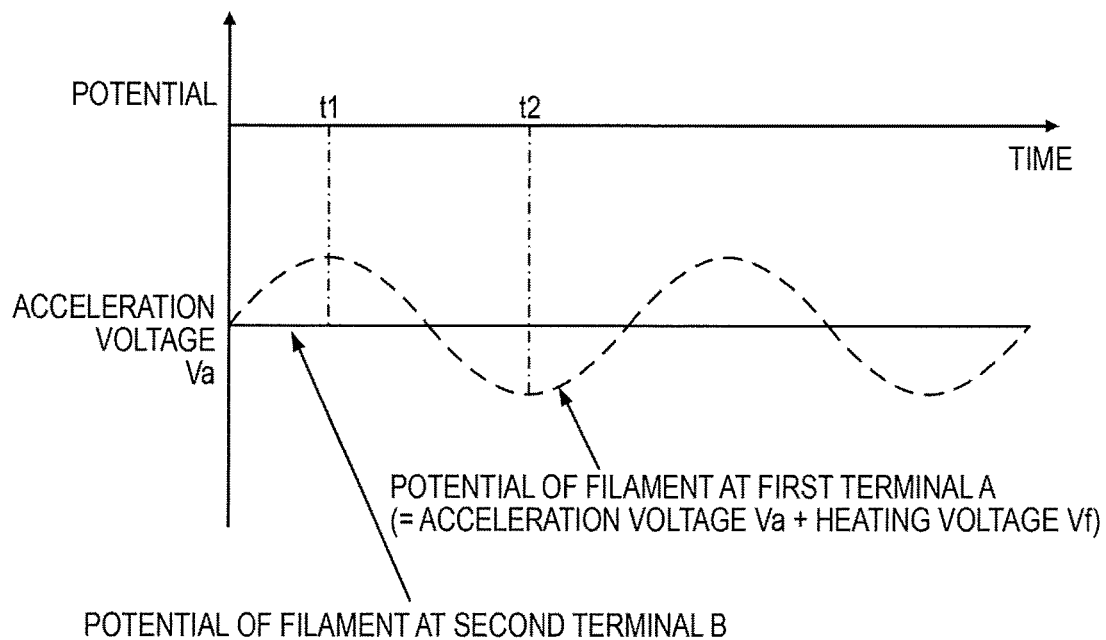
FIG. 3A is a timing chart showing temporal changes in potentials of a filament at a first terminal A and second terminal B.

FIG. 3A shows temporal changes in potentials of the filament 130 at the first terminal A and second terminal B. The abscissa indicates time, and the ordinate indicates a potential. The DC acceleration voltage Va supplied from the acceleration power supply 150 is supplied to the second terminal B of the filament 130. On the other hand, a voltage obtained by adding the DC acceleration voltage Va and an AC voltage Vf generated by the heating power supply 140 is supplied to the first terminal A of the filament 130.

Figure 3B:
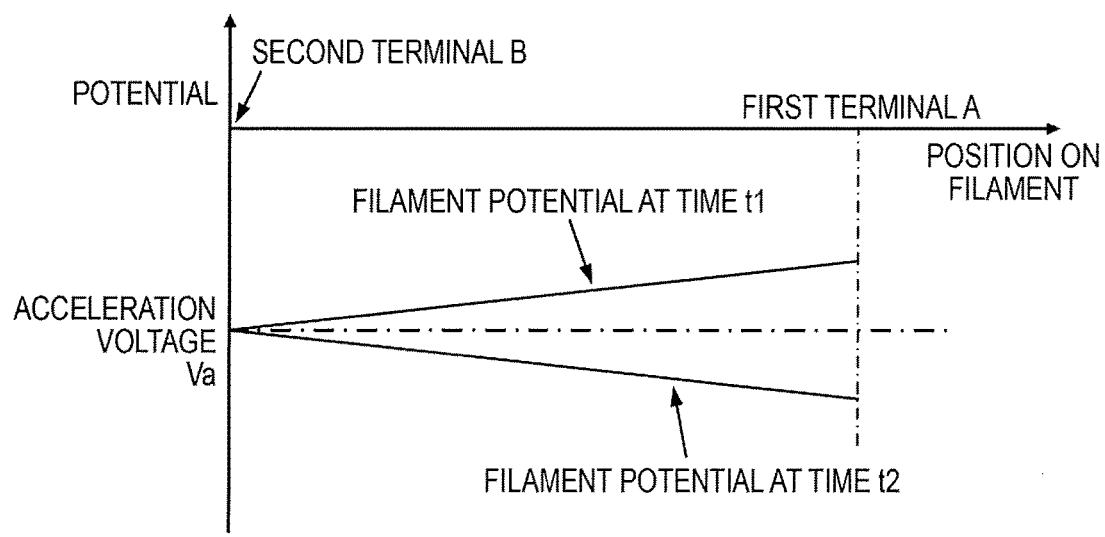
FIG. 3B is a chart showing the potential of the filament at times t1 and t2.

FIG. 3B shows the potential of the filament 130 at times t1 and t2 of FIG. 3A. The abscissa indicates a position on the filament 130, and the ordinate indicates a potential. If the filament 130 is lower in potential than the electron reflection plate 120, some of the thermoelectrons emitted from the filament 130 can be drawn into the electron reflection plate 120. The resistor 160 acts so as to restrict the magnitude of a current flowing via the path 170. This means that the thermoelectrons emitted from the filament 130 are restricted in being drawn into the electron reflection plate 120. The thermoelectrons emitted from the filament 130 are restricted in being drawn into the electron reflection plate 120, allowing the thermoelectrons emitted from the filament 130 to enter the heater 110 with a low loss. This makes it possible to improve in-plane uniformity in heat generation in the heater 110. As described above, according to this embodiment, it is possible to improve the in-plane uniformity in heat generation in the heater 110 by a simple arrangement change made by adding the resistor 160.

Figure 4:
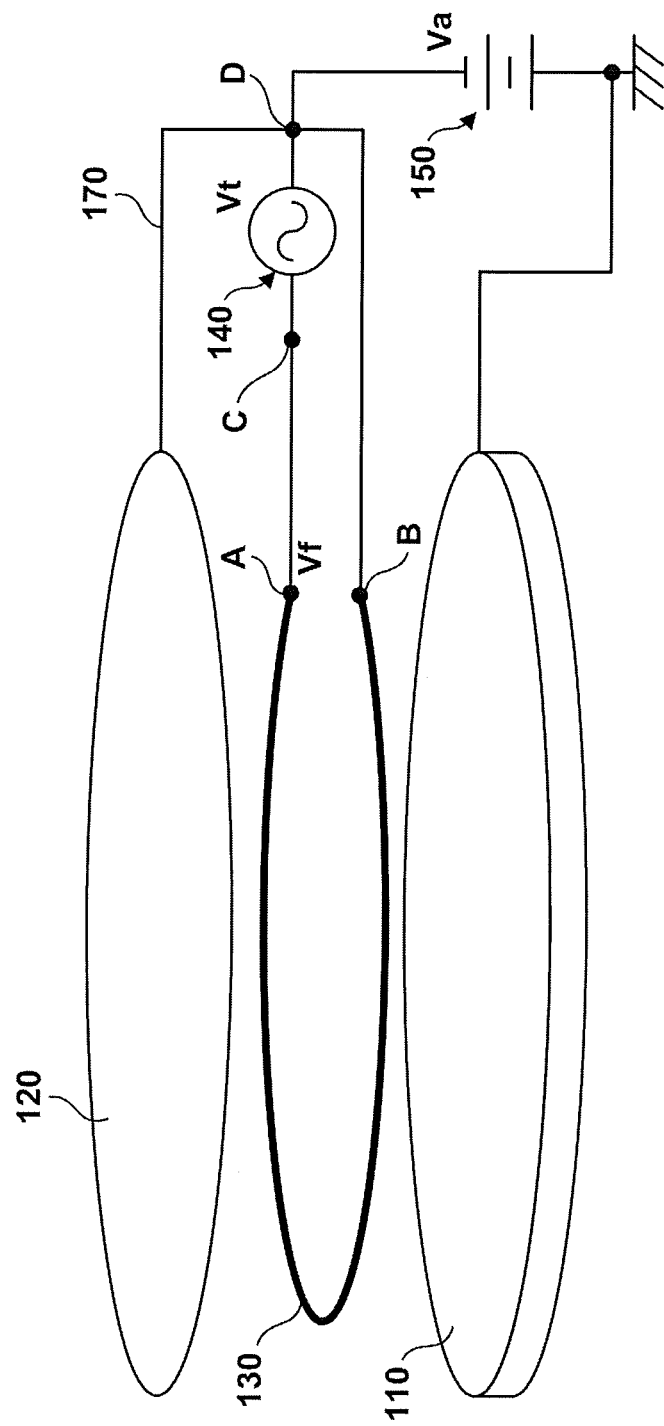
FIG. 4 is a view showing the arrangement of a heating apparatus as a comparative example.

An effect obtained by providing the resistor 160 will be described below in comparison with a comparative example. FIG. 4 shows an arrangement obtained by removing a resistor 160 from a heating apparatus 101 shown in FIGS. 1 and 2. A DC acceleration voltage Va supplied from an acceleration power supply 150 is supplied to a second terminal B of a filament 130. On the other hand, a voltage Vf obtained by adding the DC acceleration voltage Va and an AC voltage Vt generated by a heating power supply 140 is supplied to a first terminal A of the filament 130. The acceleration voltage Va is also supplied to an electron reflection plate 120.

Figure 5:
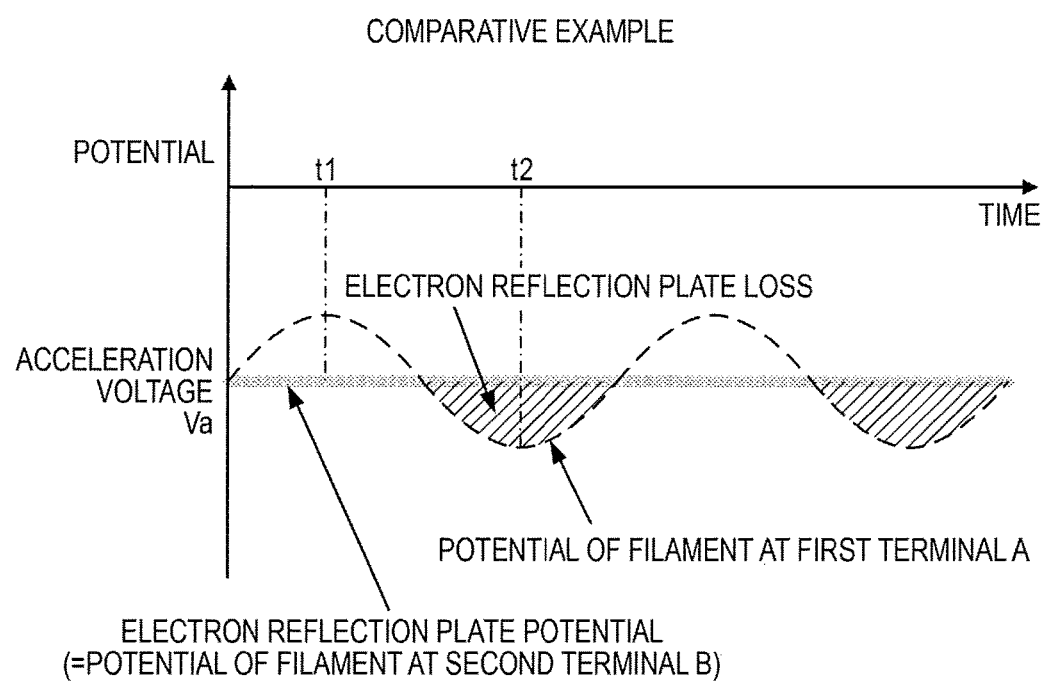
FIG. 5 is a timing chart showing a period during which an electron reflection plate loss occurs in the comparative example.

FIG. 5 shows temporal changes in potential of the electron reflection plate 120 and potential of the filament 130 at the first terminal A in the comparative example shown in FIG. 4. The abscissa indicates time, and the ordinate indicates a potential. The potential of the filament 130 at the second terminal B is the acceleration voltage Va and is constant. Further, in the comparative example, the acceleration voltage Va is directly supplied to the electron reflection plate 120, and thus the potential of the electron reflection plate 120 is the acceleration voltage Va and is constant. In a period during which the filament 130 is lower in potential than the electron reflection plate 120, some of the thermoelectrons emitted from the filament 130 can be drawn into the electron reflection plate 120. This means that a negative current flows from the filament 130 to the electron reflection plate 120, in other words, a positive current flows from the electron reflection plate 120 to the filament 130. If such a current flows, thermoelectrons entering a heater 110 from the filament 130 are decreased accordingly. A decrease in thermoelectrons entering the heater 110 by drawing some of the thermoelectrons into the electron reflection plate 120 as described above will be referred to as an electron reflection plate loss.

In FIG. 5, each hatched portion indicates the electron reflection plate loss. The potential difference between the filament 130 and the electron reflection plate 120 increases from the second terminal B to the first terminal A. This means that the number of thermoelectrons drawn into the electron reflection plate 120 changes depending on the position of the filament 130, and thus the number of thermoelectrons entering the heater 110 changes depending on the position. Consequently, a nonuniform heat distribution may occur in the heater 110. This may bring about nonuniformity in annealing of a substrate S.

Figure 6A:
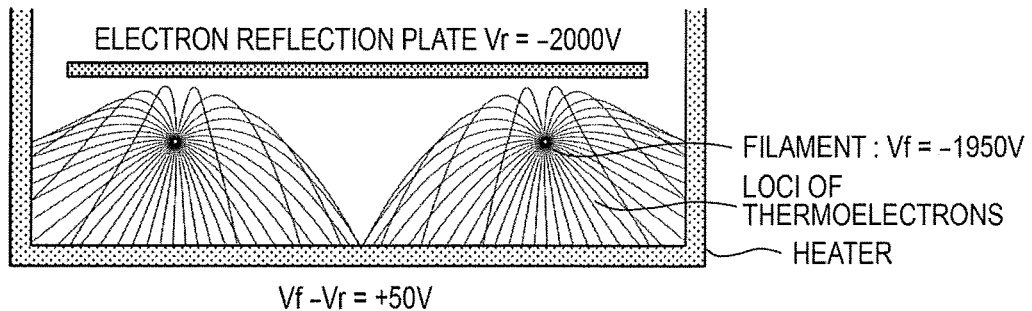
FIG. 6A is a view showing a simulation result on the electron reflection plate loss in the comparative example.
Figure 6B:
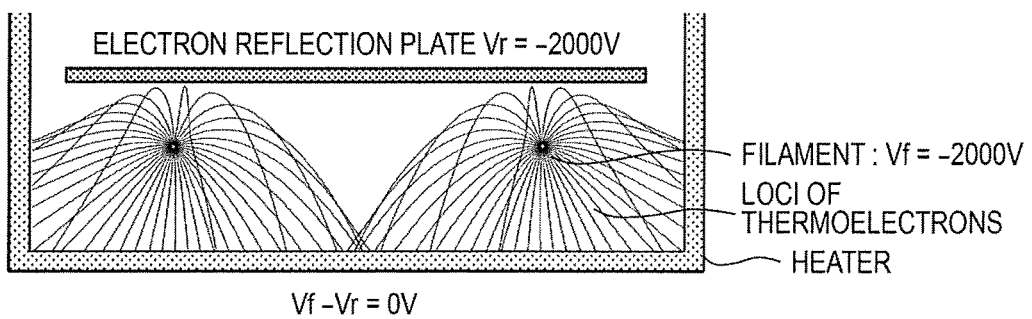
FIG. 6B is a view showing a simulation result on the electron reflection plate loss in the comparative example.
Figure 6C:
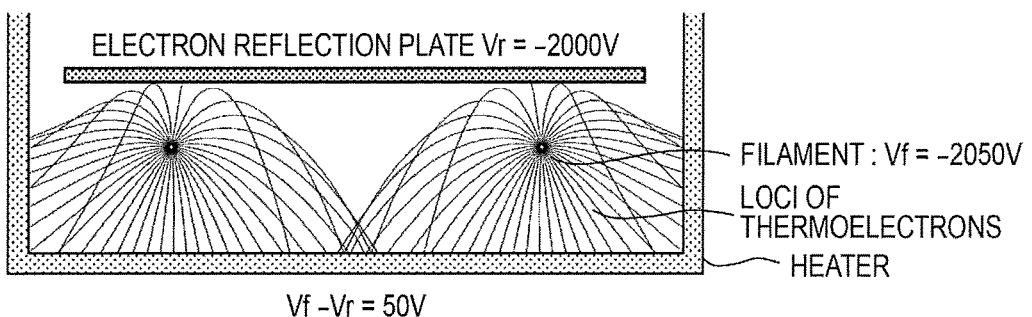
FIG. 6C is a view showing a simulation result on the electron reflection plate loss in the comparative example.

Each of FIGS. 6A to 6C shows a simulation result on the electron reflection plate loss near the first terminal A of the filament 130. FIG. 6A shows the loci of the thermoelectrons when a potential Vr (=acceleration voltage Va) of an electron reflection plate is −2,000 V, and the potential Vf of the filament at the first terminal A is −1,950 V. In FIG. 6A, the potential Vf of the filament (at the first terminal A) is higher than the potential Vr of the electron reflection plate, and thus the thermoelectrons enter the heater without being drawn into the electron reflection plate.

FIG. 6B shows the loci of the thermoelectrons when the potential Vr (=acceleration voltage Va) of the electron reflection plate is −2,000 V, and the potential Vf of the filament at the first terminal A is −2,000 V. In FIG. 6B, the potential Vf of the filament (at the first terminal A) is equal to the potential Vr of the electron reflection plate, and thus thermoelectrons enter the heater without being drawn into the electron reflection plate.

FIG. 6C shows the loci of the thermoelectrons when the potential Vr (=acceleration voltage Va) of the electron reflection plate is −2,000 V, and the potential Vf of the filament at the first terminal A is −2,050 V. In FIG. 6C, the potential Vf of the filament (at the first terminal A) is lower than the potential Vr of the electron reflection plate, and thus some of the thermoelectrons are drawn into the electron reflection plate, causing the electron reflection plate loss. Consequently, the number of electrons entering the heater and a heat generation amount are decreased. The closer to the first terminal A of the filament 130, the greater an electron reflection loss is.

Figure 7:
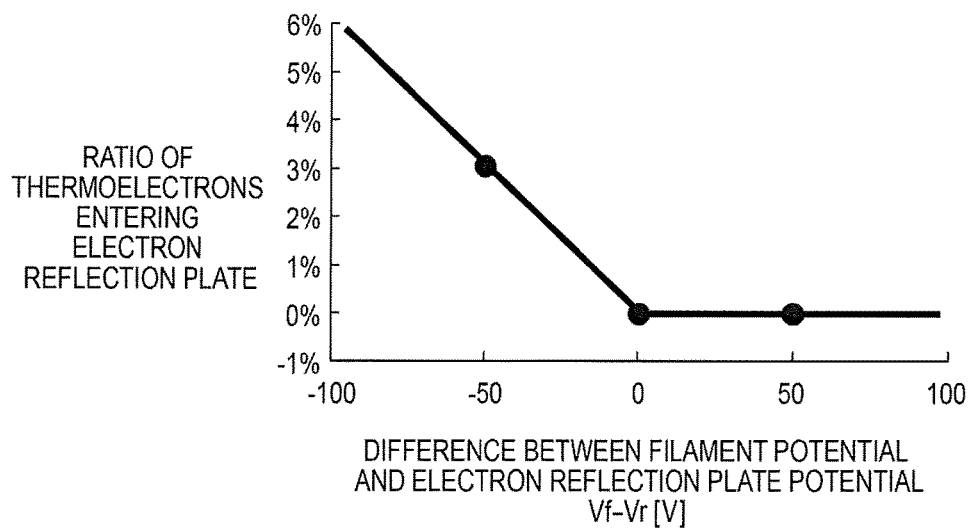
FIG. 7 is a graph showing a simulation result on the electron reflection plate loss in the comparative example.

FIG. 7 shows, in the comparative example, a change in ratio of the thermoelectrons (electron reflection plate loss) entering the electron reflection plate 120 when a difference (Vf−Vr) between the potential Vf of the filament 130 at the first terminal A and the potential Vr (=Va) of the electron reflection plate 120 is changed. The ratio of the thermoelectrons entering the electron reflection plate 120 is a value obtained by dividing the number of thermoelectrons entering the electron reflection plate 120 by the number of thermoelectrons entering the heater 110. The number of electrons entering the electron reflection plate 120 is proportional to a current flowing between the filament 130 and the electron reflection plate 120 (a current flowing through a path 170). This current will be referred to as an electron reflection plate current. The number of electrons entering the heater 110 is proportional to a current flowing through the acceleration power supply 150. This current will be referred to as an emission current. If (Vf−Vr) is −50 V, about 3% of the thermoelectrons enter the electron reflection plate 120. That is, the electron reflection plate loss is about 3%. In this case, if the emission current is 10 A, the electron reflection plate current is 0.3 A.

Assume that the AC voltage Vt generated by the heating power supply 140 is Vm·sin(ωt). Since Vf−Vr=Vm·sin(wt), assuming that Vm is 50 V, Vf−Vr when the potential Vf of the filament 130 at the first terminal A is the lowest relative to the potential of the electron reflection plate 120 (that is, when the greatest electron reflection plate loss is obtained) is −50 V. The electron reflection plate loss (maximum value) at this time is about 3%.

The electron reflection plate loss is caused in each hatched portion in FIG. 5. Therefore, letting Lm be a maximum value of the electron reflection plate loss, the time average of the electron reflection plate loss is Lm/π (half a value (2Lm/π) obtained by integrating an absolute value of a sine wave). That is, the time average of the electron reflection loss is about ⅓ of the maximum value of the electron reflection plate loss. Thus, when the maximum value of the electron reflection plate loss is about 3%, the time average of the electron reflection plate loss is about 1%. A decrease in temperature of about 6° C. when the time average of the electron reflection plate loss is 1% is obtained by an analysis in a simulation.

As described above, it is found in the comparative example that a difference in temperature of the heater 110 between the position facing the first terminal A of the filament 130 and the position facing the second terminal B is about 6° C. when the maximum value of the AC voltage Vt generated by the heating power supply 140 is 50 V.

An effect when the resistor 160 is provided as in the embodiment shown in FIGS. 1 and 2 will be described below. The electron reflection plate current when (Vf−Vr) is −50 V is 0.3 A as described above, and thus a resistance value Rs between the filament 130 and the electron reflection plate 120 is 50 V/0.3 A=167Ω. Providing the resistor 160 having a resistance value Rr means that the resistance of the resistance value Rs and the resistor 160 of the resistance value Rr are connected to the path 170 in series.

In order to reduce the electron reflection loss, it is only necessary to reduce a current flowing through the path 170 (or a closed circuit CC). Therefore, it is only necessary to set the resistance value Rr of the resistor 160 to an appropriate value. If the resistance value Rr of the resistor 160 is too small, the effect obtained by providing the resistor 160 is reduced. On the other hand, if the resistance value Rr of the resistor 160 is too large, the electron reflection plate 120 approaches a floating state, and thus the potential of the electron reflection plate 120 may become unstable. If the electron reflection plate 120 becomes lower in potential than the filament 130 by making the potential of the electron reflection plate 120 unstable, the electric field between the electron reflection plate 120 and the heater 110 changes, the loci of the thermoelectrons emitted from the filament change, the position at which the thermoelectrons enter the heater 110 changes, and the temperature distribution of the heater 110 changes.

For example, noise generated from the heating power supply 140, the acceleration power supply 150, and the like is considered as a factor for making the potential of the electron reflection plate 120 unstable. The resistance value Rr of the resistor 160 can depend on a required specification. However, it can have, for example, a resistance value from 100Ω (inclusive) to 100 kΩ (inclusive), preferably has a resistance value from 1 kΩ (inclusive) to 10 kΩ (inclusive), and more preferably has a resistance value from 2 kΩ (inclusive) to 4 kΩ (inclusive).

A method of deciding the resistance value Rr of the resistor 160 will be exemplified below. The aforementioned comparative example is an example without the resistor 160, and the decrease in temperature by the electron reflection plate loss in this example is 6° C.

Figure 8:
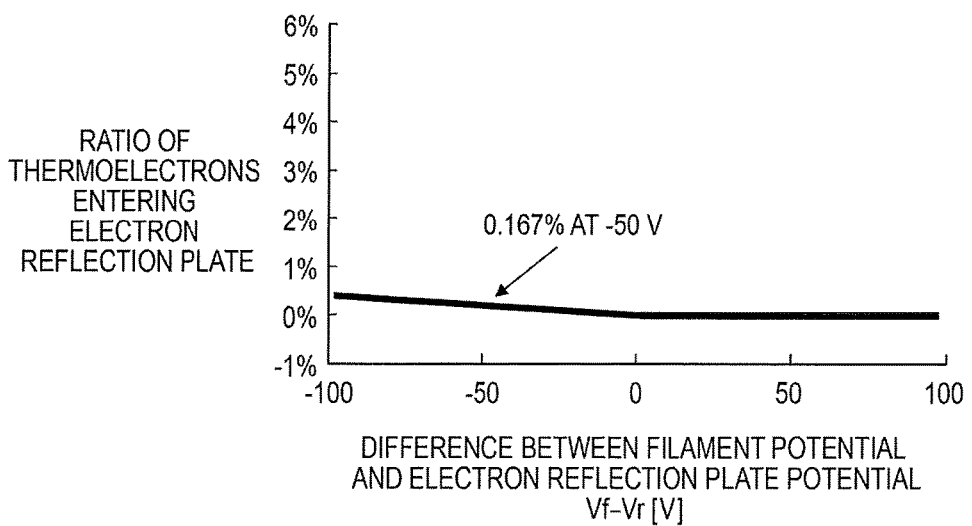
FIG. 8 is a graph showing the target of an electron reflection plate loss in the heating apparatus according to the embodiment of the present invention.

A design objective here is to set the decrease in temperature by the electron reflection plate loss within 1° C. by arranging, in the path 170, the resistance of the resistance value Rs (the resistance between the filament 130 and the electron reflection plate 120) and the resistor 160 of the resistance value Rr in series. In the comparative example, the decrease in temperature of the electron reflection plate 120 when the electron reflection plate loss is 1% is 6° C. Therefore, in order to set the decrease in temperature to within 1° C., the electron reflection plate loss can be set to 1%×⅙≈0.167% by a simple calculation. FIG. 8 shows a characteristic in which the ratio of the thermoelectrons entering the electron reflection plate 120 when (Vf−Vr)=−50 V becomes 0.167%.

If the emission current is set to 10 A following the comparative example, a change amount Δl of the emission current (the current flowing between the filament 130 and the electron reflection plate 120) corresponding to 0.167% of the electron reflection plate loss is 10 A×0.167%=0.0167 A. Since (Vf−Vr)=−50 V,

*Rr+Rs*=50 V/0.0167 A≈3,000Ω holds. The resistance value Rs between the filament 130 and the electron reflection plate 120 is 167Ω as described above, and thus the resistance value Rr of the resistor 160 is 2.8 kΩ. That is, in this example, the decrease in temperature (non-uniformity in temperature) of the heater 110 can be controlled within 1° C. by setting the resistance value Rr of the resistor 160 to 2.8 kΩ or more.

Figure 9:
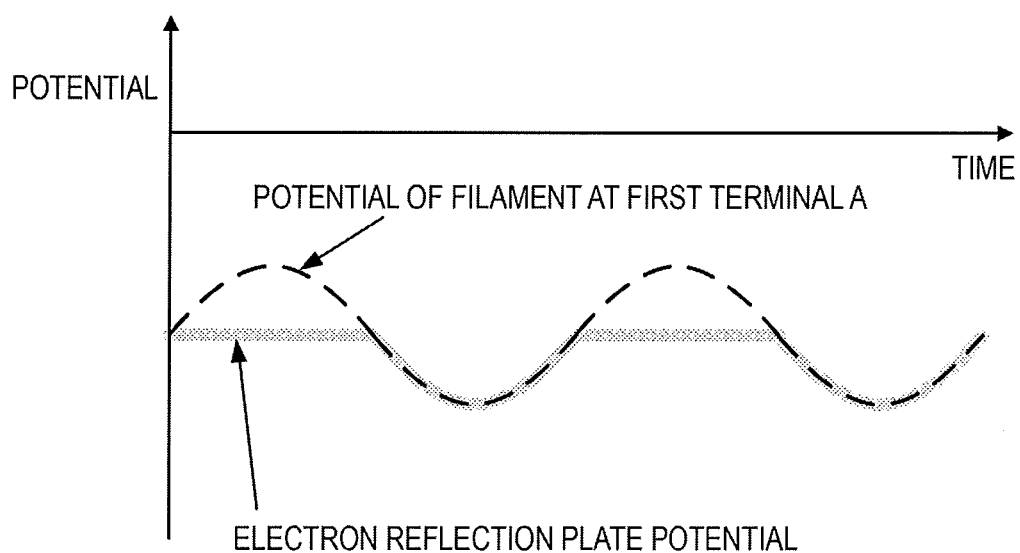
FIG. 9 is a timing chart showing the potential of an electron reflection plate and the potential of the filament at the first terminal A in the heating apparatus according to the embodiment of the present invention.

FIG. 9 shows the potential of the electron reflection plate 120 and the potential of the filament 130 at the first terminal A in a substrate heating apparatus 100 (heating apparatus 101) shown in FIGS. 1 and 2. Providing the resistor 160, the resistor 160 receives the potential difference between the electron reflection plate 120 and the first terminal A of the filament 130. Accordingly, the potential of the electron reflection plate 120 is also decreased in accordance with a decrease in potential of the filament 130 at the first terminal A. Consequently, the amount of the thermoelectrons emitted from the filament 130 that are drawn into the electron reflection plate 120 is reduced. That is, the electron reflection plate loss is reduced. Note that while a decrease in potential of the electron reflection plate 120 is caused by drawing the thermoelectrons emitted from the filament 130 into the electron reflection plate 120, drawing of the thermoelectrons by the electron reflection plate 120 is relaxed by decreasing the potential of the electron reflection plate 120.

Figure 10:
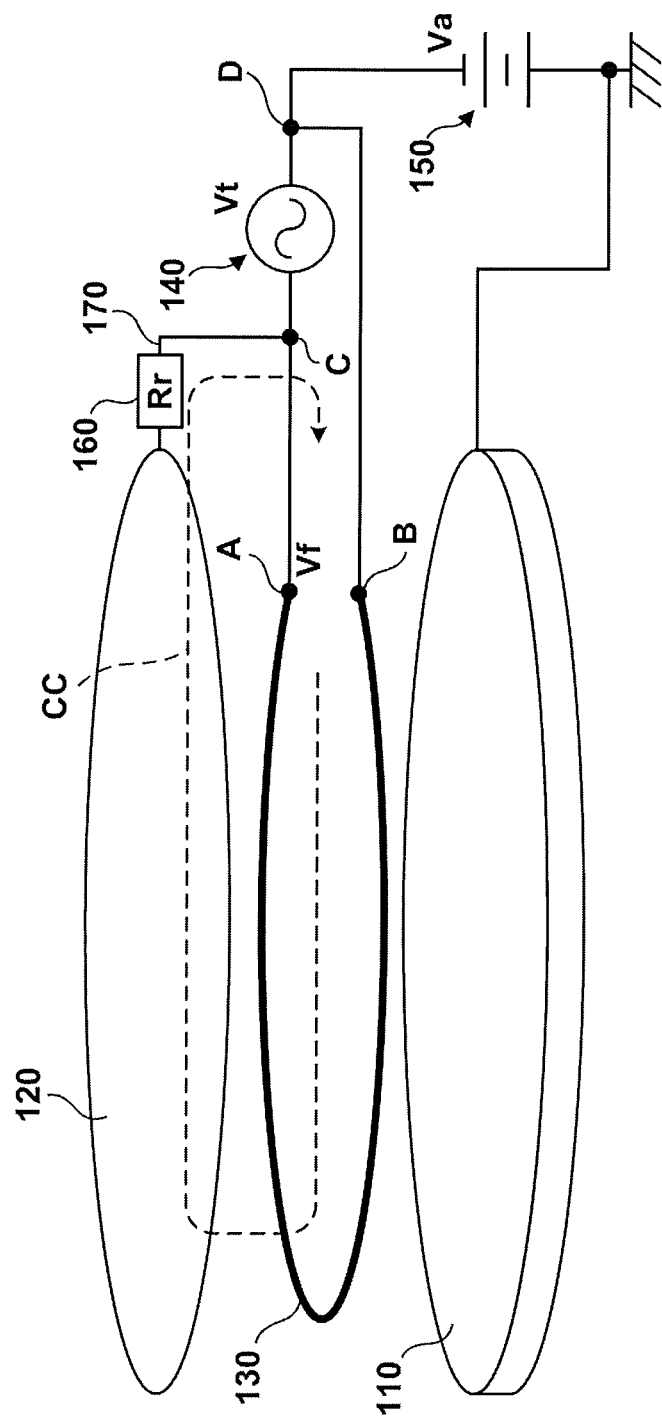
FIG. 10 is a view showing the arrangement of the heating apparatus as a modification.

FIG. 10 shows a modification of the substrate heating apparatus 100 (heating apparatus 101) shown in FIGS. 1 and 2. In the modification, the heating power supply 140 includes the third terminal C connected to the first terminal A of the filament 130 and the fourth terminal D connected to the second terminal B of the filament 130, and the acceleration power supply 150 supplies the acceleration voltage Va between the fourth terminal D and the heater 110. The resistor 160 forms the path 170 which connects the electron reflection plate 120 and the third terminal C. The heating power supply 140 supplies a current to the filament 130, forming the closed circuit CC passing through the filament 130 and the electron reflection plate 120. The path 170 connects the electron reflection plate 120 and the node (in this example, the third terminal C) in the closed circuit CC. The acceleration voltage Va and the AC voltage Vt are supplied to the electron reflection plate 120 via the resistor 160. In such connection, the resistor 160 also reduces the current flowing between the filament 130 and the electron reflection plate 120, and functions so as to reduce the electron reflection plate loss.

A device manufacturing method of manufacturing a device by using the substrate heating apparatus 100 will be exemplified below. The device manufacturing method can include a step of implanting an impurity in a substrate such as an SiC substrate and an annealing step of heating the substrate by the substrate heating apparatus 100. The device manufacturing method can further include a step of etching the substrate, a step of forming a pattern on the substrate, and the like.

REFERENCE SIGNS LIST

100 . . . substrate heating apparatus
110 . . . heater
112 . . . space
114 . . . vacuum chamber
120 . . . electron reflection plate
120 . . . filament
140 . . . heating power supply
150 . . . acceleration power supply
160 . . . resistor
170 . . . path
180 . . . substrate holding unit
190 . . . chamber
192 . . . process space
CC . . . closed circuit
A . . . first terminal
B . . . second terminal
C . . . third terminal
D . . . fourth terminal

The invention claimed is:
1. A heating apparatus comprising:
a heater;
an electron reflection plate;
a filament arranged between the heater and the electron reflection plate;

a heating power supply configured to supply an AC voltage between a first terminal and a second terminal of the filament to emit thermoelectrons from the filament;

an acceleration power supply configured to supply an acceleration voltage between the filament and the heater;

a resistor arranged so as to form a path which connects the electron reflection plate and the heating power supply; and wherein the heating power supply supplies the AC voltage to the filament, forming a closed circuit passing through the filament, the electron reflection plate, and the path.

2. A heating apparatus comprising:
a heater;
an electron reflection plate;
a filament arranged between the heater and the electron reflection plate;
a heating power supply configured to supply an AC voltage between a first terminal and a second terminal of the filament to emit thermoelectrons from the filament;
an acceleration power supply configured to supply an acceleration voltage between the filament and the heater; and
a resistor arranged so as to form a path which connects the electron reflection plate and the heating power supply;
wherein the heating power supply includes a third terminal connected to the first terminal of the filament and a fourth terminal connected to the second terminal of the filament, the acceleration power supply supplies the acceleration voltage between the fourth terminal and the heater, and the resistor forms the path so as to connect the electron reflection plate and the fourth terminal.

3. A heating apparatus comprising:
a heater;
an electron reflection plate;
a filament arranged between the heater and the electron reflection plate;

a heating power supply configured to supply an AC voltage between a first terminal and a second terminal of the filament to emit thermoelectrons from the filament;
an acceleration power supply configured to supply an acceleration voltage between the filament and the heater; and
a resistor arranged so as to form a path which connects the electron reflection plate and the heating power supply;
wherein the heating power supply includes a third terminal connected to the first terminal of the filament and a fourth terminal connected to the second terminal of the filament, the acceleration power supply supplies the acceleration voltage between the fourth terminal and the heater, and the resistor forms the path so as to connect the electron reflection plate and the third terminal.

4. The heating apparatus according to claim 1, wherein the resistor has a resistance value higher than a resistance value between the filament and the electron reflection plate in a state in which the heating power supply supplies the AC voltage to the filament.

5. The heating apparatus according to claim 1, wherein the resistor has a resistance value within a range not less than 100Ω and not greater than 100 kΩ.

6. The heating apparatus according to claim 5, wherein the resistor has a resistance value within a range not less than 1 kΩ and not greater than 10 kΩ.

7. The heating apparatus according to claim 1, wherein the resistor contains a molybdenum silicide alloy.

8. The heating apparatus according to claim 1, wherein the filament is a single loop filament.

9. A substrate heating apparatus comprising:
a substrate holding unit configured to hold a substrate; and
a heating apparatus defined in claim 1 arranged so as to heat the substrate held by the substrate holding unit.

10. A device manufacturing method comprising:
a step of implanting an impurity in a substrate; and
a step of heating the substrate by using a substrate heating apparatus defined in claim 9.

* * * * *